(12) United States Patent
Eeh et al.

(10) Patent No.: US 11,127,445 B2
(45) Date of Patent: Sep. 21, 2021

(54) MAGNETIC DEVICE

(71) Applicants: TOSHIBA MEMORY CORPORATION, Tokyo (JP); SK HYNIX INC., Icheon-si (KR)

(72) Inventors: Young Min Eeh, Seongnam-si (KR); Taeyoung Lee, Icheon-si (KR); Kazuya Sawada, Seoul (KR); Eiji Kitagawa, Seoul (KR); Taiga Isoda, Seoul (KR); Tadaaki Oikawa, Seoul (KR); Kenichi Yoshino, Seongnam-si (KR)

(73) Assignees: TOSHIBA MEMORY CORPORATION, Tokyo (JP); SK HYNIX INC., Gyeonggi-Do (KR)

( * ) Notice: Subject to any disclaimer, the term of this patent is extended or adjusted under 35 U.S.C. 154(b) by 98 days.

(21) Appl. No.: 16/352,137

(22) Filed: Mar. 13, 2019

(65) Prior Publication Data
US 2020/0082857 A1 Mar. 12, 2020

(30) Foreign Application Priority Data
Sep. 11, 2018 (JP) .............................. JP2018-169562

(51) Int. Cl.
*G11C 11/16* (2006.01)
*H01L 43/10* (2006.01)
(Continued)

(52) U.S. Cl.
CPC ........ *G11C 11/161* (2013.01); *H01F 10/3254* (2013.01); *H01F 10/3286* (2013.01);
(Continued)

(58) Field of Classification Search
CPC ....... G11C 11/161; H01L 43/02; H01L 43/10; H01L 43/12; H01L 27/228; H01L 43/08;
(Continued)

(56) References Cited

U.S. PATENT DOCUMENTS 7,602,592 B2   10/2009   Fukuzawa et al.
7,894,244 B2   2/2011    Hayakawa et al.
(Continued)

FOREIGN PATENT DOCUMENTS

CN   107221596 A    9/2017
JP   2006332340 A   12/2006
(Continued)

OTHER PUBLICATIONS

Ji, et al., "Perpendicular magnetic anisotropy and high spin-polarization ratio in epitaxial Fe—N thin films", Physical Review B vol. 84, Iss. 24, 245310, Dec. 15, 2011.
(Continued)

*Primary Examiner* — Steven H Loke
*Assistant Examiner* — Juanita B Rhodes
(74) *Attorney, Agent, or Firm* — Holtz, Holtz & Volek PC

(57) ABSTRACT

According to one embodiment, a magnetic device includes a magnetic tunnel junction element, the magnetic tunnel junction element comprising: a first structure having ferromagnetism; a second structure having ferromagnetism; and a first nonmagnet provided between the first structure and the second structure; wherein: the first structure and the second structure are antiferromagnetically coupled via the first nonmagnet; and the first structure includes a first ferromagnetic nitride.

15 Claims, 9 Drawing Sheets

(51) Int. Cl.
*H01F 10/32* (2006.01)
*H01L 27/22* (2006.01)
*H01L 43/02* (2006.01)
*H01L 43/12* (2006.01)
*H01F 41/32* (2006.01)

(52) U.S. Cl.
CPC ........... *H01F 41/32* (2013.01); *H01L 27/228* (2013.01); *H01L 43/02* (2013.01); *H01L 43/10* (2013.01); *H01L 43/12* (2013.01)

(58) Field of Classification Search
CPC ... H01L 27/224; H01F 10/3286; H01F 41/32; H01F 10/3254; H01F 10/3272
See application file for complete search history.

(56) References Cited

U.S. PATENT DOCUMENTS

| | | | |
|---|---|---|---|
| 8,609,262 | B2 | 12/2013 | Horng et al. |
| 9,508,926 | B2 | 11/2016 | Kitagawa et al. |
| 2002/0044396 | A1* | 4/2002 | Amano ............... H01F 10/3254 360/324.2 |
| 2006/0017081 | A1 | 1/2006 | Sun et al. |
| 2013/0021841 | A1* | 1/2013 | Zhou ................... G11C 11/5607 365/158 |
| 2013/0242435 | A1* | 9/2013 | Fuji ...................... G11B 5/3983 360/244 |
| 2016/0254442 | A1* | 9/2016 | Sawada .................. H01L 43/10 257/421 |
| 2019/0080833 | A1 | 3/2019 | Eeh et al. |

FOREIGN PATENT DOCUMENTS

| | | |
|---|---|---|
| JP | 2011023729 A | 2/2011 |
| JP | 2013016820 A | 1/2013 |
| JP | 2019054054 A | 4/2019 |
| TW | 200629271 | 8/2006 |

OTHER PUBLICATIONS

Parkin, "Systematic Variation of the Strength and Oscillation Period of Indirect Magnetic Exchange Coupling through the 3d, 4d, and 5d Transition Metals", Physical Review Letters, vol. 67, No. 25, Dec. 16, 1991.

* cited by examiner

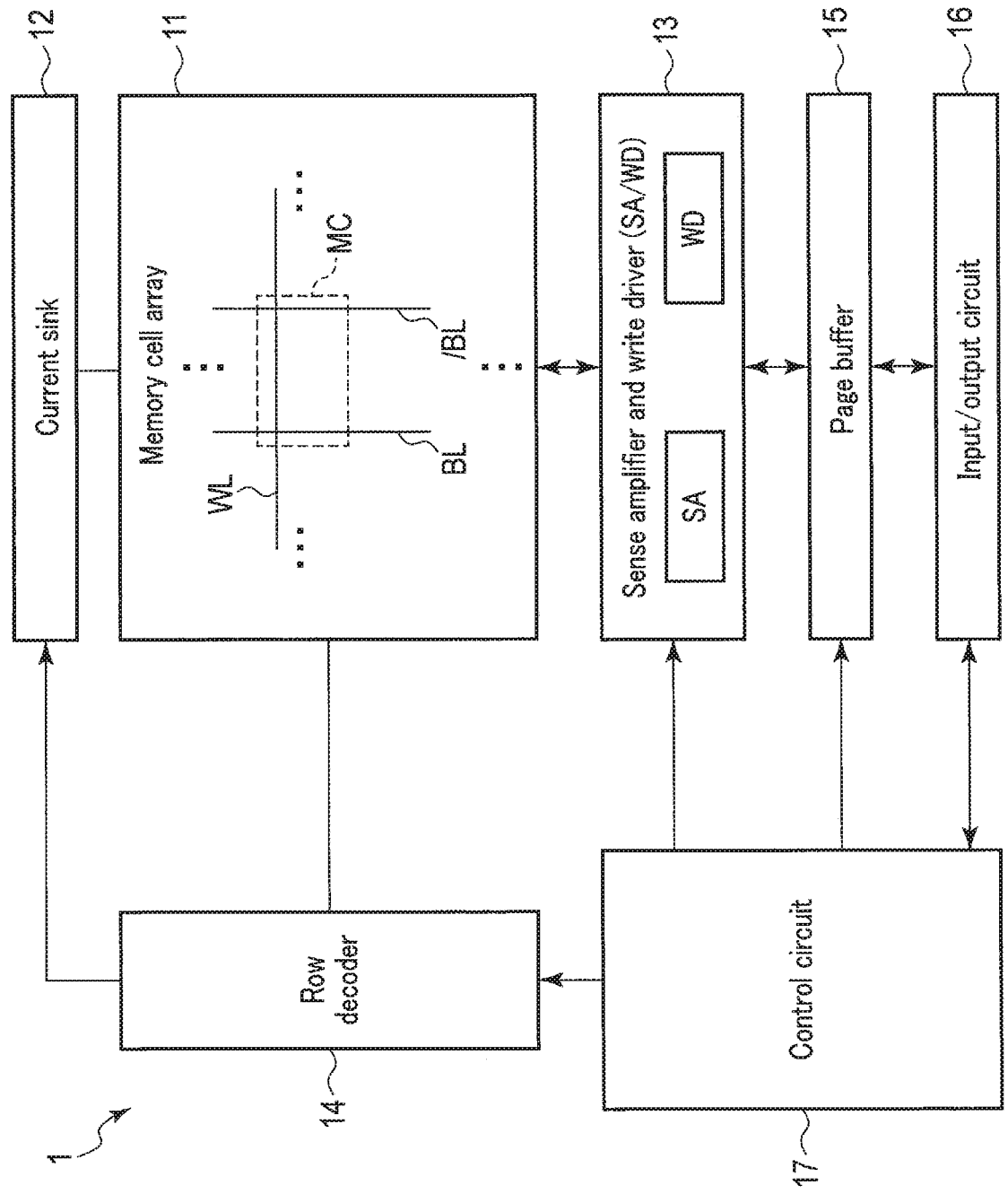
F I G. 1

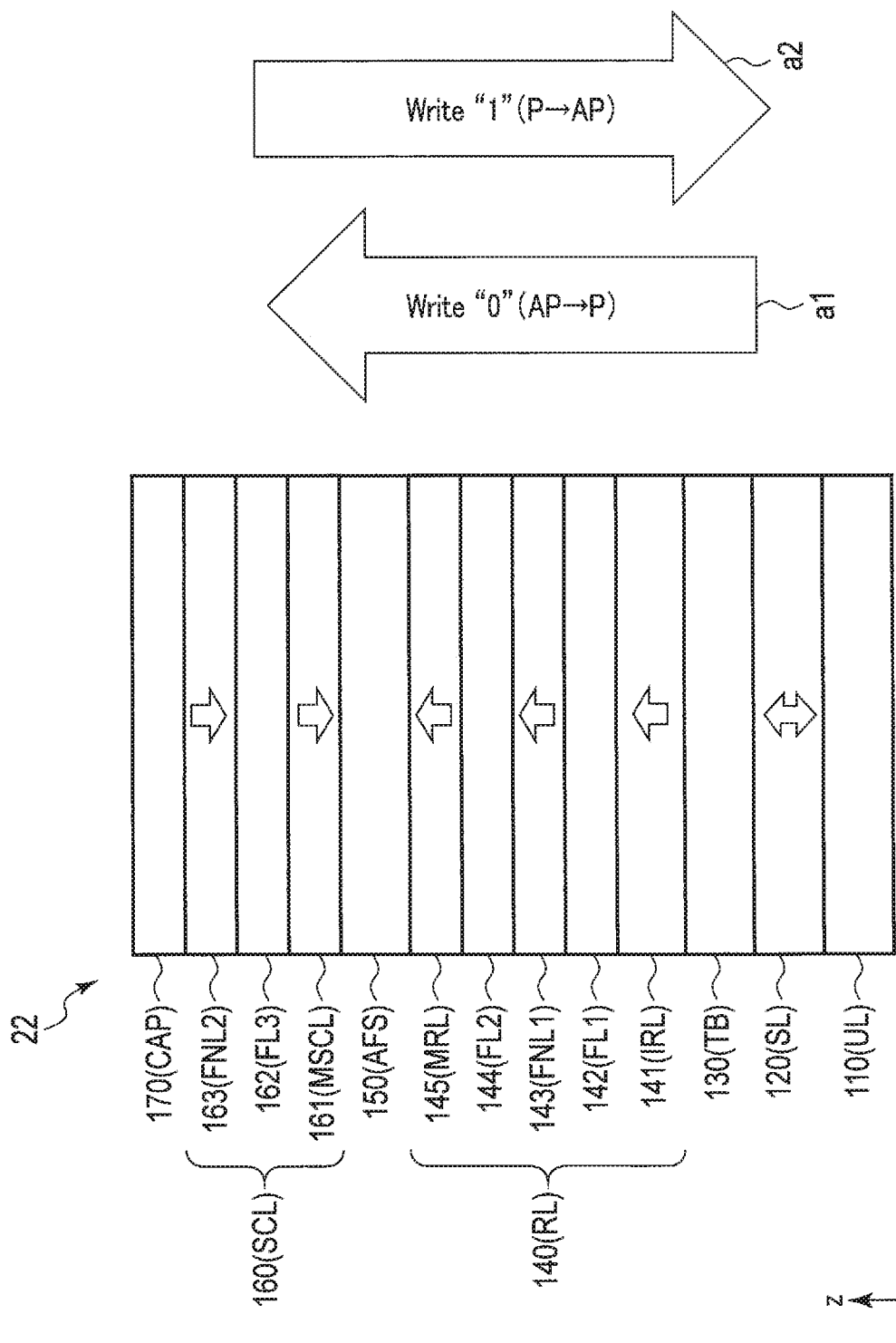
F I G. 3

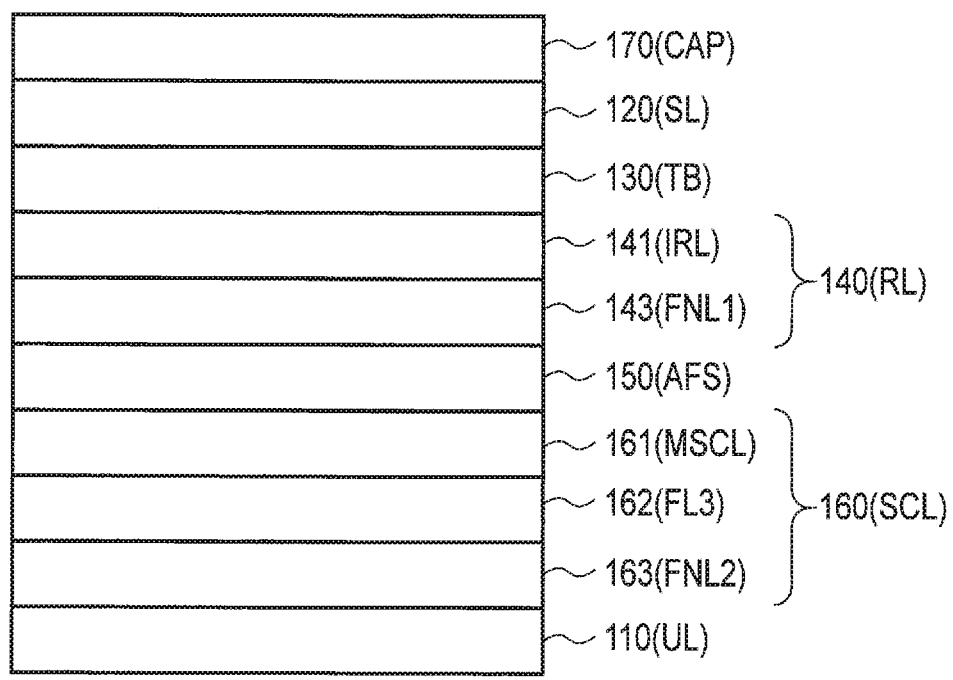
F I G. 14

MAGNETIC DEVICE

CROSS-REFERENCE TO RELATED APPLICATIONS

This application is based upon and claims the benefit of priority from Japanese Patent Application No. 2018-169562, filed Sep. 11, 2018, the entire contents of which are incorporated herein by reference.

FIELD

Embodiments described herein relate generally to a magnetic device.

BACKGROUND

Magnetic devices including magnetic elements are known.

BRIEF DESCRIPTION OF THE DRAWINGS

FIG. 1 is a block diagram for explaining a configuration of a magnetic device according to a first embodiment.

FIG. 3 is a schematic diagram for explaining a configuration of a magnetic tunnel junction element of the magnetic device according to the first embodiment.

FIG. 14 is a schematic diagram for explaining a configuration of a magnetic tunnel junction element of the magnetic device according to a modification of the first embodiment.

DETAILED DESCRIPTION

Figure 2:
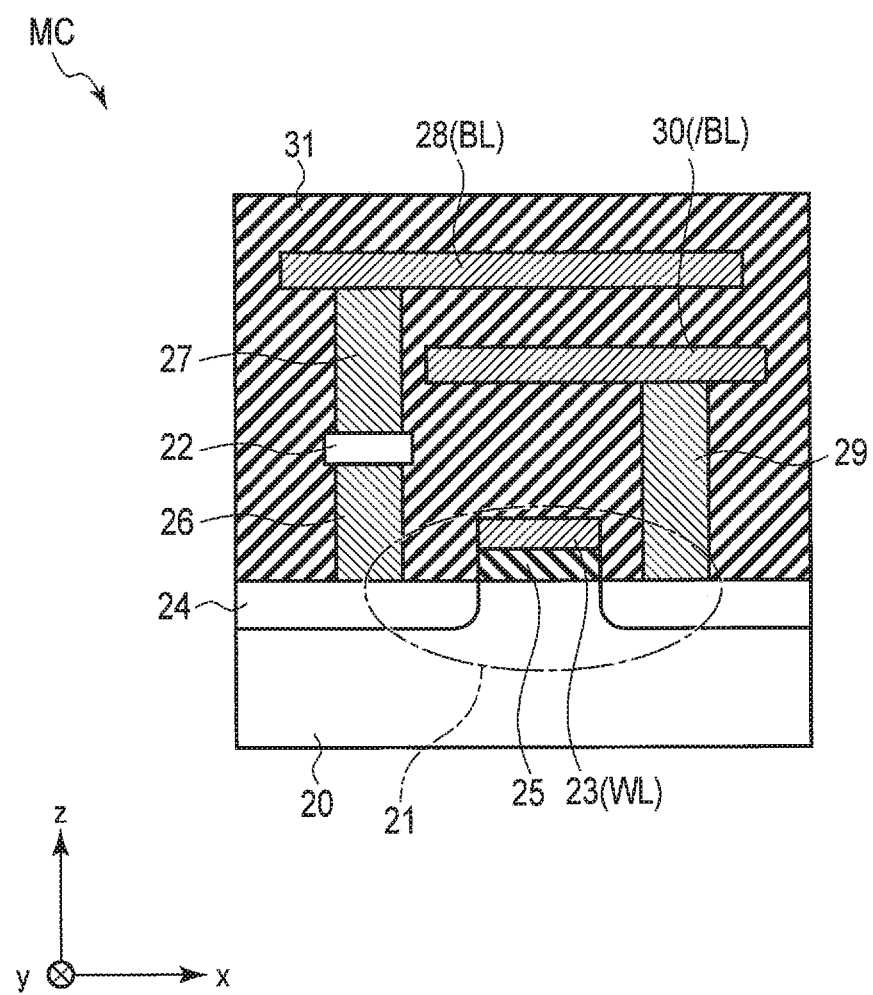
FIG. 2 is a cross-sectional view for explaining a configuration of a memory cell of the magnetic device according to the first embodiment.

In general, according to one embodiment, a magnetic device includes a magnetic tunnel junction element, the magnetic tunnel junction element comprising: a first structure having ferromagnetism; a second structure having ferromagnetism; and a first nonmagnet provided between the first structure and the second structure; wherein: the first structure and the second structure are antiferromagnetically coupled via the first nonmagnet; and the first structure includes a first ferromagnetic nitride.

Embodiments will be described with reference to the accompanying drawings. In the explanation below, constituent elements having the same functions and configurations will be denoted by the same reference symbols. To distinguish a plurality of constituent elements with the same reference symbol from one another, an additional symbol is added after the same reference symbol. If there is no need to mutually distinguishing a plurality of constituent elements, the plurality of structural elements are assigned with only the same reference symbol without an additional symbol.

1. First Embodiment

A magnetic device according to the first embodiment will be described. The magnetic device of the first embodiment includes a perpendicular magnetization type magnetic memory device (MRAM: Magnetoresistive Random Access Memory) using, for example, a magnetoresistive element (MTJ: Magnetic Tunnel Junction) element as a memory element.

In the following, the magnetic memory device as an example of the magnetic device will be explained.

1.1. Configuration

A configuration of the magnetic device according to the first embodiment will be described.

1.1.1. Configuration of Magnetic Device

FIG. 1 is a block diagram showing a configuration of the magnetic device according to the first embodiment. As shown in FIG. 1, the magnetic device 1 includes a memory cell array 11, a current sink 12, a sense amplifier and write driver (SA/WD) 13, a row decoder 14, a page buffer 15, an input/output circuit 16, and a control circuit 17.

The memory cell array 11 includes a plurality of memory cells MC arranged in rows and columns. For example, memory cells MC arranged in the same row are coupled to the same word line WL, and both ends of each of the memory cells MC arranged in the same column are coupled to the same bit line BL and the same source line /BL.

The current sink 12 is coupled to the bit line BL and the source line /BL. The current sink 12 defines the bit line BL or the source line /BL as a ground potential in an operation, such as data write and read operations.

The SA/WD 13 is coupled to the bit line BL and the source line /BL. The SA/WD 13 supplies a current to a memory cell MC, which is an operation target, via the bit line BL and the source line /BL to write data to the memory cell MC. The SA/WD 13 supplies a current to a memory cell MC, which is an operation target, via the bit line BL and the source line /BL to read data from the memory cell MC. More specifically, a write driver of the SA/WD 13 writes data to the memory cell MC, and a sense amplifier of the SA/WD 13 reads data from the memory cell MC.

The row decoder 14 is coupled to the memory cell array 11 via the word line WL. The row decoder 14 decodes a row address that designates a row direction of the memory cell array 11. A word line WL is then selected in accordance with the result of decoding, and a voltage necessary for an operation, such as data write and data read operation, is applied to the selected word line WL.

The page buffer 15 temporarily stores data to be written to the memory cell array 11 and data read from the memory cell array 11 in units of data called "pages".

The input/output circuit 16 sends various signals received from the outside of the magnetic device 1 to the control circuit 17 and the page buffer 15, and sends various information from the control circuit 17 and the page buffer 15 to the outside of the magnetic device 1.

The control circuit 17 is coupled to the current sink 12, the SA/WD 13, the row decoder 14, the page buffer 15, and the input/output circuit 16. The control circuit 17 controls the current sink 12, the SA/WD 13, the row decoder 14, and the page buffer 15 in accordance with the various signals received by the input/output circuit 16 from the outside of the magnetic device 1.

1.1.2. Configuration of Memory Cell

A configuration of the memory cell array of the magnetic device according to the first embodiment will be described with reference to FIG. 2. In the following explanation, a plane parallel to the surface of a semiconductor substrate 20 is referred to as an xy plane, and an axis perpendicular to the xy plane is referred to as a z axis. An x axis and a y axis are defined as axes perpendicular to each other in the xy plane. FIG. 2 is an example of a cross-sectional view, taken along an xz plane, showing a part of the memory cell MC of the magnetic device 1 according to the first embodiment.

As shown in FIG. 2, the memory cell MC is provided on the semiconductor substrate 20 and includes a select transistor 21 and a magnetic tunnel junction element 22. The select transistor 21 serves as a switch for controlling supply and stop of a current at the time of data write to and data read from the magnetic tunnel junction element 22. The magnetic tunnel junction element 22 includes a plurality of multi-layered films. By applying a current to the film surfaces of the plurality of films in a perpendicular direction, a resistance value of the magnetic tunnel junction element 22 can be switched between a low resistance state and a high resistance state. The magnetic tunnel junction element 22 serves as a memory element that is configured so that data can be written in accordance with the change of the resistance state, stores written data in a non-volatile manner, and is configured so that the resistance state can be read.

The select transistor 21 includes a gate coupled to a wiring layer 23 that serves as a word line WL, and a pair of source and drain regions 24 provided on both sides of the gate in the x direction in a surface of the semiconductor substrate 20. Of the select transistor 21, a region included in the semiconductor substrate 20 is also referred to as an active region. For example, the active region of one memory cell MC is isolated from an active region of another memory cell MC by an element isolation region (STI: Shallow Trench Isolation) (not shown), so that the active regions cannot be electrically connected.

The wiring layer 23, extending in the y direction, is provided via an insulation layer above the semiconductor substrate 20, and commonly coupled to a gate of a select transistor 21 (not shown) of another memory cell MC arranged alongside the one memory cell MC in, for example, the y direction. Wiring layers 23 are arranged side by side, for example, in the x direction.

One end of the select transistor 21 is coupled to a lower surface of the magnetic tunnel junction element 22 via a contact plug 26 provided on the source or drain region 24. A contact plug 27 is provided on an upper surface of the magnetic tunnel junction element 22. The magnetic tunnel junction element 22 is coupled to a wiring layer 28 that serves as a bit line BL via the contact plug 27. The wiring layer 28, extending in the x direction, is coupled to a magnetic tunnel junction element 22 (not shown) of another memory cell MC arranged alongside the one memory cell in, for example, the x direction.

The other end of the select transistor 21 is coupled to a wiring layer 30 that serves as a source line /BL via a contact plug 29 provided on the source or drain region 24. The wiring layer 30, extending in the x direction, is coupled to the other end of a select transistor 21 (not shown) of another memory cell MC arranged alongside the one memory cell in the x direction.

The wiring layers 28 and 30 are arranged, for example, in the y direction. The wiring layer 28 is located, for example, above the wiring layer 30. The wiring layers 28 and 30 are arranged to avoid physical and electric interference with each other, though this point is not shown in FIG. 2. The select transistor 21, the magnetic tunnel junction element 22, the wiring layers 23, 28, and 30, and the contact plugs 26, 27, and 29 are covered with an interlayer insulation film 31.

The magnetic tunnel junction element 22 and another magnetic tunnel junction element (not shown) arranged alongside in the x or y direction are provided on, for example, the same level. Thus, in the memory cell array 11, the magnetic tunnel junction elements 22 are arranged, for example, in a direction in which the semiconductor substrate 20 extends.

1.1.3. Magnetic Tunnel Junction Element

A configuration of the magnetic tunnel junction element of the magnetic device according to the first embodiment will be described with reference to FIG. 3. FIG. 3 is a schematic view of an example of a cross section of the magnetic tunnel junction element of the magnetic device according to the first embodiment, taken along a plane perpendicular to the xy plane.

As shown in FIG. 3, the magnetic tunnel junction element 22 includes, for example, a non-magnetic layer 110 serving as an underlayer, a ferromagnetic layer 120 serving as a storage layer, a non-magnetic layer 130 serving as a tunnel barrier layer, a ferromagnetic layer 140 serving as a reference layer, a non-magnetic layer 150 serving as an antiferromagnetic spacer, a ferromagnetic layer 160 serving as a shift canceling layer, and a non-magnetic layer 170 serving as a capping layer. In FIG. 3 and the subsequent figures, the non-magnetic layer 110, the ferromagnetic layer 120, the non-magnetic layer 130, the ferromagnetic layer 140, the non-magnetic layer 150, the ferromagnetic layer 160, and the non-magnetic layer 170 are respectively represented also as "UL", "SL", "TB", "RL", "AFS", "SCL", and "CAP".

In the magnetic tunnel junction element 22, a plurality of layers, for example, the non-magnetic layer (UL) 110, the ferromagnetic layer (SL) 120, the non-magnetic layer (TB) 130, the ferromagnetic layer (RL) 140, the non-magnetic layer (AFS) 150, the ferromagnetic layer (SCL) 160, and the non-magnetic layer (CAP) 170, are layered in this order from the side of the semiconductor substrate 20 in the z-axis direction. The magnetic tunnel junction element 22 is a perpendicular magnetization type MTJ element, in which the magnetization orientation of each of the ferromagnetic layer (SL) 120, the ferromagnetic layer (RL) 140, and the ferromagnetic layer (SCL) 160 is perpendicular to the film surface.

The non-magnetic layer (UL) 110 is a non-magnetic layer having electrical conductivity, and includes at least one of an oxygen compound and a nitrogen compound, for example, magnesium oxide (MgO), aluminum oxide (AlO), zinc oxide (ZnO), titanium oxide (TiO), magnesium nitride (MgN), zirconium nitride (ZrN), niobium nitride (NbN), silicon nitride (SiN), aluminum nitride (AlN), hafnium nitride (HfN), tantalum nitride (TaN), tungsten nitride (WN), chromium nitride (CrN), molybdenum nitride (MoN), titanium nitride (TiN), and vanadium nitride (VN). The non-magnetic layer (UL) 110 may include a mixture of any of the aforementioned oxygen compounds or nitrogen compounds. In other words, the non-magnetic layer (UL) 110 may include not only a binary compound made of two kinds of elements, but also a ternary compound made of three kinds of elements, such as aluminum titanium nitride (AlTiN). An oxygen compound or a nitrogen compound suppresses an increase of a damping constant of a magnetic layer in contact with these compounds, and can achieve an effect of reducing a write current. Furthermore, by using an oxygen compound or a nitrogen compound that is a high-melting-point metal, it is possible to prevent a material of the underlying layer from diffusing to a magnetic layer and to prevent degradation of an MR ratio. In this description, the high-melting-point metal refers to a material having a melting point higher than that of iron (Fe) and cobalt (Co); for example, zirconium (Zr), hafnium (Hf), tungsten (W), chromium (Cr), molybdenum (Mo), niobium (Nb), titanium (Ti), tantalum (Ta), and vanadium (V).

The ferromagnetic layer (SL) 120 is a layer that has electrical conductivity and includes a ferromagnetic material having an axis of easy magnetization in a direction perpendicular to a film surface, and includes at least one of iron (Fe), cobalt (Co), and nickel (Ni). More specifically, the ferromagnetic layer (SL) 120 may include, for example, cobalt iron boron (CoFeB) or iron boride (FeB). The ferromagnetic layer (SL) 120 may further include, as an impurity, at least one of boron (B), phosphorus (P), carbon (C), aluminum (Al), silicon (Si), tantalum (Ta), molybdenum (Mo), chromium (Cr), hafnium (Hf), tungsten (W), and titanium (Ti). The ferromagnetic layer (SL) 120 has a magnetization orientation toward either the semiconductor substrate 20 or the ferromagnetic layer (RL) 140. The magnetization orientation of the ferromagnetic layer (SL) 120 is set to reverse more easily as compared to the ferromagnetic layer (RL) 140.

The non-magnetic layer (TB) 130 is a layer including a non-magnetic material, and includes, for example, at least one of magnesium oxide (MgO), aluminum oxide (AlO), zinc oxide (ZnO), titanium oxide (TiO), and LSMO (lanthanum-strontium-manganese oxide). In crystallization processing of the ferromagnetic layer (SL) 120 and the ferromagnetic layer (RL) 140 adjacent to each other, the non-magnetic layer (TB) 130 also serves as a seed material that is a core to grow a crystalline film from an interface between the ferromagnetic layer (SL) 120 and the ferromagnetic layer (RL) 140. Details of the crystallization processing will be described later.

The ferromagnetic layer (RL) 140 is a ferromagnetic layer that has an axis of easy magnetization in a direction perpendicular to the film surface. The magnetization orientation of the ferromagnetic layer (RL) 140 is fixed and directed toward either the ferromagnetic layer (SL) 120 or the ferromagnetic layer (SCL) 160 (in the example shown in FIG. 3, the orientation is directed toward the ferromagnetic layer (SCL) 160). The expression "magnetization orientation is fixed" means that the magnetization orientation does not change by a current having an amount that is capable of reversing the magnetization orientation of the ferromagnetic layer (SL) 120. The non-magnetic layer (TB) 130 serves as a tunnel barrier layer, so that the ferromagnetic layer (SL) 120, the non-magnetic layer (TB) 130, and the ferromagnetic layer (RL) 140 form a magnetic tunnel junction.

The ferromagnetic layer (RL) 140 includes a ferromagnetic layer 141 serving as an interface reference layer, a non-magnetic layer 142 serving as a function layer, a ferromagnetic nitride layer 143, a non-magnetic layer 144 serving as a function layer, and a ferromagnetic layer 145 serving as a main reference layer. In the ferromagnetic layer (RL) 140, a plurality of layers, for example, the ferromagnetic layer 141, the non-magnetic layer 142, the ferromagnetic nitride layer 143, the non-magnetic layer 144, and the ferromagnetic layer 145, are layered in this order from the side of the semiconductor substrate 20 in the z-axis direction. In FIG. 3 and the subsequent figures, the ferromagnetic layer 141, the non-magnetic layer 142, the ferromagnetic nitride layer 143, the non-magnetic layer 144, and the ferromagnetic layer 145 are respectively represented also as "IRL", "FL1", "FNL1", "FL2", and "MRL".

The ferromagnetic layer (IRL) 141, as well as the ferromagnetic layer (SL) 120, includes at least one of iron (Fe), cobalt (Co), and nickel (Ni). More specifically, the ferromagnetic layer (IRL) 141 may include, for example, cobalt iron boron (CoFeB) or iron boride (FeB). Also, the ferromagnetic layer (IRL) 141, as well as the ferromagnetic layer (SL) 120, may include at least one of the aforementioned impurities.

The non-magnetic layer (FL1) 142 is a non-magnetic film that includes, for example, at least one of tantalum (Ta), molybdenum (Mo), tungsten (W), rhodium (Rh), iridium (Ir), ruthenium (Ru), and platinum (Pt). The non-magnetic layer (FL1) 142 serves to cancel a difference in crystal structure between the ferromagnetic layer (IRL) 141 and the ferromagnetic nitride layer (FNL1) 143, and to improve the orientations of the ferromagnetic layer (IRL) 141 and the ferromagnetic nitride layer (FNL1) 143.

The ferromagnetic nitride layer (FNL1) 143 is a ferromagnetic layer that has an axis of easy magnetization in a direction perpendicular to the film surface. The ferromagnetic nitride layer (FNL1) 143 includes a nitrogen compound of at least one element selected from ferromagnetic materials, such as iron (Fe), cobalt (Co), and nickel (Ni). Such a nitrogen compound is, for example, iron nitride, cobalt nitride, and nickel nitride.

The ferromagnetic nitride includes a covalent bond and while maintaining the electrical conductivity and magnetic moment has satisfactory heat resistance and serves as a diffusion barrier. Thus, the ferromagnetic nitride in the ferromagnetic nitride layer (FNL1) 143 is not liable to diffuse, even if it receives heat during the crystallization processing of the ferromagnetic layer (IRL) 141 or the like. As a result, the ferromagnetic materials in, for example, the ferromagnetic layer (IRL) 141 and the ferromagnetic layer (MRL) 145 are not liable to enter the ferromagnetic nitride layer (FNL1) 143 by diffusion. In this connection, the ferromagnetic materials in the ferromagnetic layer (IRL) 141 and the ferromagnetic layer (MRL) 145 are prevented from diffusing out of the ferromagnetic layer (IRL) 141 and the ferromagnetic layer (MRL) 145.

Furthermore, as disclosed in, for example, PHYSICAL REVIEW B 84, 245310 (2011), the crystal structure of iron nitride or the like grows in a vertical direction as the nitride concentration increases, and the crystal structure changes from the body-centered cubic (BCC) lattice of iron to the body centered tetragonal (BCT) lattice. Accordingly, high perpendicular magnetic anisotropy (PMA) occurs.

The non-magnetic layer (FL2) 144 is a non-magnetic film that includes, for example, at least one of platinum (Pt), tantalum (Ta), molybdenum (Mo), tungsten (W), rhodium (Rh), iridium (Ir), and ruthenium (Ru). The non-magnetic layer (FL2) 144 serves to improve the orientation of the crystal structures of the ferromagnetic nitride layer (FNL1) 143 and the ferromagnetic layer (MRL) 145.

The ferromagnetic layer (MRL) 145 is a ferromagnetic layer that has an axis of easy magnetization in a direction perpendicular to the film surface. As well as, for example, the ferromagnetic layer (SL) 120 and the ferromagnetic layer (IRL) 141, the ferromagnetic layer (MRL) 145 includes at least one of iron (Fe), cobalt (Co), and nickel (Ni). More specifically, the ferromagnetic layer (MRL) 145 may include, for example, cobalt iron boron (CoFeB) or iron boride (FeB). In addition, the ferromagnetic layer (MRL) 145, as well as the ferromagnetic layer (SL) 120 and the ferromagnetic layer (IRL) 141, may further include at least one of the aforementioned impurities.

The ferromagnetic layer (IRL) 141, the ferromagnetic nitride layer (FNL1) 143, and the ferromagnetic layer (MRL) 145 are bonded together ferromagnetically, so that the magnetization orientations of those layers are parallel to one another. Therefore, the ferromagnetic layer (RL) 140 including the ferromagnetic layer (IRL) 141, the non-magnetic layer (FL1) 142, the ferromagnetic nitride layer (FNL1) 143, the non-magnetic layer (FL2) 144, and the ferromagnetic layer (MRL) 145 can be regarded as one large ferromagnetic structure having perpendicular magnetization.

The non-magnetic layer (AFS) 150 is a non-magnetic film, and includes, for example, at least one of ruthenium (Ru), iridium (Ir), rhodium (Rh), and osmium (Os). The non-magnetic layer (AFS) 150 serves to bond the ferromagnetic layer (RL) 140 and the ferromagnetic layer (SCL) 160 together antiferromagnetically.

The ferromagnetic layer (SCL) 160 is a ferromagnetic layer having an axis of easy magnetization in a direction perpendicular to the film surface. The ferromagnetic layer (SCL) 160 includes a ferromagnetic layer 161 serving as a main shift canceling layer, a non-magnetic layer 162 serving as a function layer, and a ferromagnetic nitride layer 163. In the ferromagnetic layer (SCL) 160, a plurality of layers, for example, the ferromagnetic layer 161, the non-magnetic layer 162, and the ferromagnetic nitride layer 163, are layered in this order from the side of the semiconductor substrate 20 in the z-axis direction. In FIG. 3 and the subsequent figures, the ferromagnetic layer 161, the non-magnetic layer 162, and the ferromagnetic nitride layer 163 are respectively represented also as "MSCL", "FL3", and "FNL2".

The ferromagnetic layer (MSCL) 161 is a ferromagnetic layer having an axis of easy magnetization in a direction perpendicular to the film surface, and antiferromagnetically bonded to the ferromagnetic layer (MRL) 145 by the non-magnetic layer (AFS) 150. Therefore, the magnetization orientation of the ferromagnetic layer (MSCL) 161 is fixed to a direction antiparallel to the magnetization orientation of the ferromagnetic layer (MRL) 145 (in the example shown in FIG. 3, toward the ferromagnetic layer (RL) 140). The magnitude of a magnetic field necessary to reverse the magnetization orientation of the ferromagnetic layer (MSCL) 161 is set to a value, for example, greater than that in the ferromagnetic layer (RL) 140.

As well as, for example, the ferromagnetic layer (MRL) 145, the ferromagnetic layer (MSCL) 161 includes at least one of iron (Fe), cobalt (Co), and nickel (Ni). More specifically, the ferromagnetic layer (MSCL) 161 may include, for example, cobalt iron boron (CoFeB) or iron boride (FeB). In addition, the ferromagnetic layer (MSCL) 161, as well as the ferromagnetic layer (MRL) 145, may further include at least one of the aforementioned impurities.

The non-magnetic layer (FL3) 162 is a non-magnetic film that includes, for example, at least one of platinum (Pt), tantalum (Ta), molybdenum (Mo), tungsten (W), rhodium (Rh), iridium (Ir), and ruthenium (Ru). The non-magnetic layer (FL3) 162 serves to improve the orientation of the ferromagnetic layer (MSCL) 161 and the ferromagnetic nitride layer (FNL2) 163.

The ferromagnetic nitride layer (FNL2) 163 is a ferromagnetic layer having an axis of easy magnetization in a direction perpendicular to the film surface. The ferromagnetic nitride layer (FNL2) 163, as well as the ferromagnetic nitride layer (FNL1) 143, includes a nitrogen compound of an at least one element selected from ferromagnetic materials, such as iron (Fe), cobalt (Co), and nickel (Ni). Such a nitrogen compound is, for example, iron nitride, cobalt nitride, and nickel nitride.

The ferromagnetic nitride includes a covalent bond while maintaining the electrical conductivity and magnetic moment has satisfactory heat resistance and serves as a diffusion barrier. Thus, the ferromagnetic nitride in the ferromagnetic nitride layer (FNL2) 163 is not liable to diffuse, even if it receives heat. As a result, compositions in the ferromagnetic layer (SCL) 160 are prevented from diffusing into the non-magnetic layer (CAP) 170, and compositions in the non-magnetic layer (CAP) 170 are prevented from diffusing into the ferromagnetic layer (SCL) 160.

The ferromagnetic layer (MSCL) 161 and the ferromagnetic nitride layer (FNL2) 163 are bonded together ferromagnetically, so that the magnetization orientations of those layers are parallel to each other. Therefore, the ferromagnetic layer (SCL) 160 including the ferromagnetic layer (MSCL) 161, the non-magnetic layer (FL3) 162, and the ferromagnetic nitride layer (FNL2) 163 can be regarded as one large ferromagnetic structure having perpendicular magnetization. A leak magnetic field from the ferromagnetic layer (SCL) 160 reduces influences of a leak magnetic field from the ferromagnetic layer (RL) 140 on the magnetization orientation of the ferromagnetic layer (SL) 120.

The non-magnetic layer (CAP) 170 is a non-magnetic film that includes, for example, at least one of platinum (Pt), tungsten (W), tantalum (Ta), and ruthenium (Ru).

It is possible to adopt, in the first embodiment, a spin injection write method in which a write current is supplied to the magnetic tunnel junction element 22 and the magnetization orientation of the ferromagnetic layer (SL) 120 is controlled by the write current. The magnetic tunnel junction element 22 can take either a low-resistance state or a high-resistance state, depending on whether the magnetization orientations of the ferromagnetic layer (SL) 120 and the ferromagnetic layer (RL) 140 are parallel or antiparallel.

If a write current flowing in the direction indicated by arrow a1 in FIG. 3, i.e., from the ferromagnetic layer (SL) 120 to the ferromagnetic layer (RL) 140, is supplied to the magnetic tunnel junction element 22, a relative relation of the magnetization orientations between the ferromagnetic layer (SL) 120 and the ferromagnetic layer (RL) 140 becomes parallel. In this parallel state, the resistance value of the magnetic tunnel junction element 22 becomes the smallest, and the magnetic tunnel junction element 22 is set to a low-resistance state. This low-resistance state is called the "P (parallel) state", and is defined as a data "0" state.

If a write current flowing in the direction indicated by arrow a2 in FIG. 3, i.e., from the ferromagnetic layer (RL) 140 to the ferromagnetic layer (SL) 120, is supplied to the magnetic tunnel junction element 22, a relative relation of the magnetization orientations between the ferromagnetic layer (SL) 120 and the ferromagnetic layer (RL) 140 becomes antiparallel. In this antiparallel state, the resistance value of the magnetic tunnel junction element 22 becomes the greatest, and the magnetic tunnel junction element 22 is set to a high-resistance state. This high-resistance state is called the "AP (anti-parallel) state", and is defined as a data "1" state.

1.2. Method of Manufacturing Magnetic Tunnel Junction Element

A method of manufacturing a magnetic tunnel junction element of a magnetic device according to the first embodiment will be described. In the following, a method of manufacturing the ferromagnetic layer (RL) 140 (reference layer RL) of all structural elements of the magnetic tunnel junction element 22 will be described. With regard to the other structural elements, descriptions thereof will be omitted.

Figure 4:
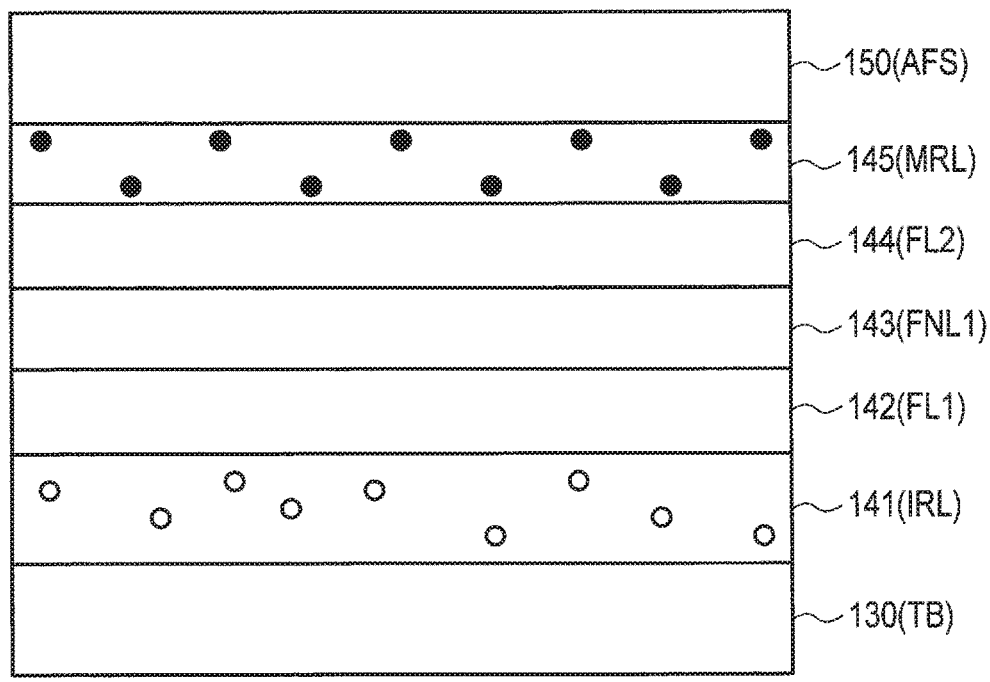
FIG. 4 is a schematic diagram for explaining a method for manufacturing the magnetic tunnel junction element of the magnetic device according to the first embodiment.
Figure 5:
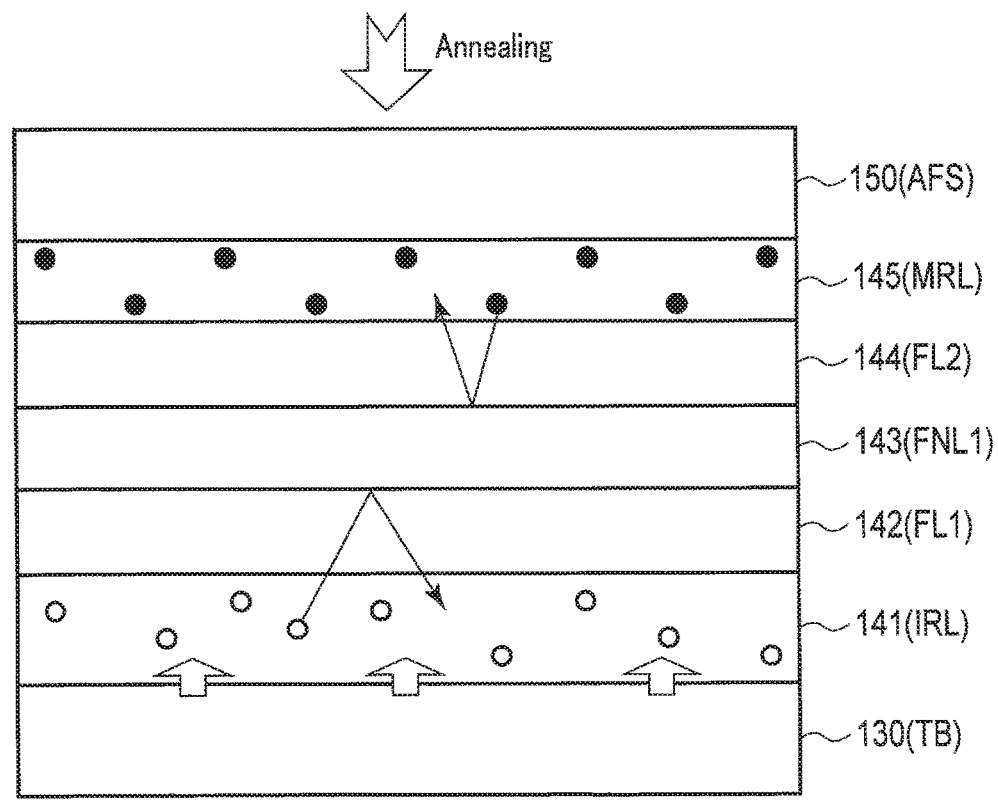
FIG. 5 is a schematic diagram for explaining a method for manufacturing the magnetic tunnel junction element of the magnetic device according to the first embodiment.
Figure 6:
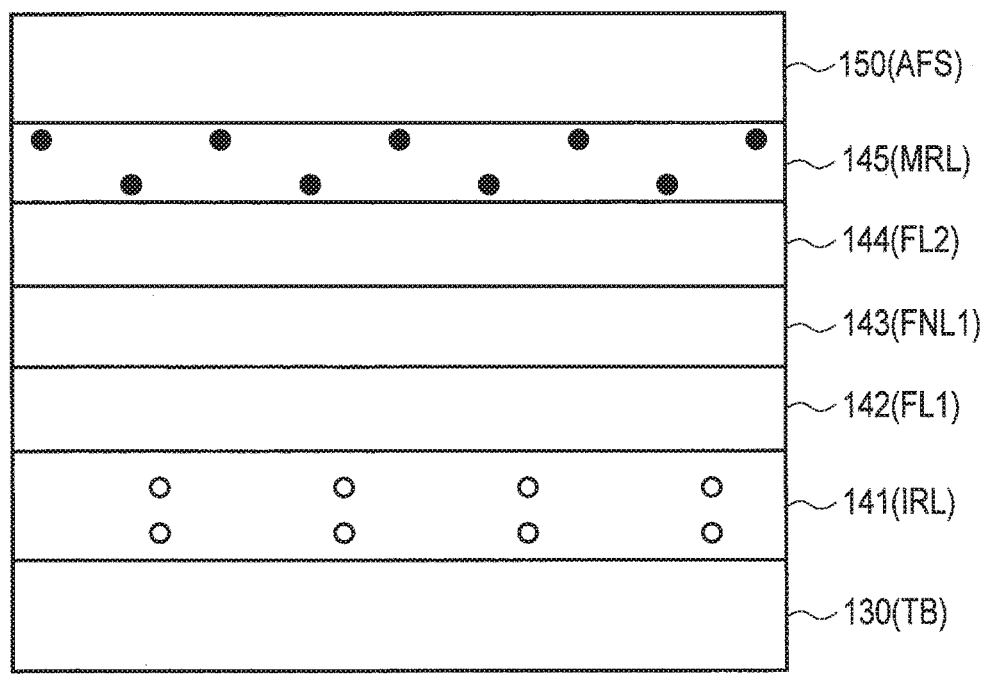
FIG. 6 is a schematic diagram for explaining a method for manufacturing the magnetic tunnel junction element of the magnetic device according to the first embodiment.

FIG. 4, FIG. 5, and FIG. 6 are schematic diagrams for explaining a method for manufacturing the magnetic tunnel junction element of the magnetic device according to the first embodiment. FIGS. 4 to 6 show a process of a change from an amorphous state to a crystalline state of the ferromagnetic layer (IRL) 141 in the ferromagnetic layer (RL) 140 by annealing, and also show a state of diffusion of the ferromagnetic material in the ferromagnetic layer (MRL) 145. For simplicity, the non-magnetic layer (UL) 110 and the ferromagnetic layer (SL) 120 layered under the non-magnetic layer (TB) 130 and the ferromagnetic layer (SCL) 160 and the non-magnetic layer (CAP) 170 layered above the non-magnetic layer (AFS) 150 are not shown.

As shown in FIG. 4, the non-magnetic layer (TB) 130, the ferromagnetic layer (IRL) 141, the non-magnetic layer (FL1) 142, the ferromagnetic nitride layer (FNL1) 143, the non-magnetic layer (FL2) 144, the ferromagnetic layer (MRL) 145, and the non-magnetic layer (AFS) 150 are layered in this order. The non-magnetic layer (TB) 130 has, for example, a cubical crystal or tetragonal crystal structure. The ferromagnetic layer (IRL) 141 as an amorphous layer including impurities is formed on the layer 130. The ferromagnetic nitride layer (FNL1) 143 can be obtained by forming a film of a mixture of nitrogen and a ferromagnetic material, for example, iron.

In FIGS. 4 to 6, for convenience, the ferromagnetic material in the ferromagnetic layer (IRL) 141 is represented as white dots, and the ferromagnetic material in the ferromagnetic layer (MRL) 145 is represented as black dots.

As shown in FIG. 5, the layers that have been layered in as shown in FIG. 4 are annealed. Specifically, the ferromagnetic layer (IRL) 141 is changed from an amorphous state to a crystalline state by externally applying heat. The non-magnetic layer (TB) 130 serves to control the orientation of the crystal structure of the ferromagnetic layer (IRL) 141. Specifically, the ferromagnetic layer (IRL) 141 grows a crystal structure using the non-magnetic layer (TB) 130 as a seed. As a result, the ferromagnetic layer (IRL) 141 is oriented in the same crystal plane as that of the non-magnetic layer (TB) 130.

As the crystal structure of the ferromagnetic layer (IRL) 141 is formed, the impurities in the ferromagnetic layer (IRL) 141 are diffused and removed. Not only the impurities, but also the ferromagnetic material in the ferromagnetic layer (IRL) 141 can be diffused. The ferromagnetic nitride layer (FNL1) 143 includes a covalent bond of nitrogen and a ferromagnetic material, for example, iron. Therefore, the ferromagnetic nitride layer (FNL1) 143 has satisfactory heat resistance. Even when the ferromagnetic nitride layer (FNL1) 143 is heated to a high temperature (300-400° C.), the ferromagnetic nitride inside the layer is prevented from diffusing externally, and ferromagnetic material existing outside is prevented from diffusing into the layer. Accordingly, as shown in FIG. 5, the ferromagnetic nitride layer (FNL1) 143 can prevent the ferromagnetic material in the ferromagnetic layer (IRL) 141 from diffusing into the ferromagnetic nitride layer (FNL1) 143 and to another layer beyond the layer 143. Similarly, the ferromagnetic nitride layer (FNL1) 143 can prevent the ferromagnetic material in the ferromagnetic layer (MRL) 145 from diffusing into the ferromagnetic nitride layer (FNL1) 143 and to another layer beyond the layer 143. Thus, mutual diffusion between the ferromagnetic material in the ferromagnetic layer (IRL) 141 and the ferromagnetic material in the ferromagnetic layer (MRL) 145 can be prevented. In addition, the diffusion of the materials in the ferromagnetic layer (RL) 140 as a whole can be suppressed by the presence of the ferromagnetic nitride layer (FNL1) 143 as compared to a case in which the layer 143 is not present.

FIG. 6 shows a state in which the annealing process is ended. Crystallization progresses in the ferromagnetic layer (IRL) 141, where most impurities have been removed. At this time, the ferromagnetic nitride layer (FNL1) 143 prevents the ferromagnetic material included in the ferromagnetic layer (IRL) 141 from diffusing outside. On the other hand, since the ferromagnetic nitride layer (FNL1) 143 prevents diffusion of the other materials, impurities for the ferromagnetic layer (IRL) 141, such as platinum and tantalum, are prevented from flowing into the ferromagnetic layer (IRL) 141. By these effects, high-quality crystallization of the ferromagnetic layer (IRL) 141 can be achieved. It is preferable that no impurities remain in the ferromagnetic layer (IRL), but a small amount of impurities may remain.

It is also preferable that no impurities mix into the ferromagnetic layer (MRL) 145 to obtain a synthetic antiferromagnetic (SAF) bond. Furthermore, it is desired to avoid diffusion of, for example, ruthenium in the non-magnetic layer (AFS) 150 by heat, resulting in assimilation of the non-magnetic layer (AFS) 150, which is thin, into the ferromagnetic layer (MRL) 145, so that the SAF bond may deteriorate. The ferromagnetic nitride layer (FNL1) 143 prevents diffusion of, for example, ruthenium in the non-magnetic layer (AFS) 150. Therefore, it is possible to suppress mixing of impurities into the ferromagnetic layer (MRL) 145 and degradation of the SAF bond due to assimilation of the non-magnetic layer (AFS) 150 into the ferromagnetic layer (MRL) 145. Since the diffusion of the materials is suppressed as described above, various properties, such as interface magnetic anisotropy, can improve.

Furthermore, the ferromagnetic layer (IRL) 141 and the ferromagnetic layer (MRL) 145 are layered with the ferromagnetic nitride layer (FNL1) 143 interposed therebetween. Therefore, the ferromagnetic layer (IRL) 141, the ferromagnetic nitride layer (FNL1) 143, and the ferromagnetic layer (MRL) 145 can be magnetically connected to one another in a magnetization process performed thereafter, and can behave as one ferromagnetic layer as a whole. In other words, the ferromagnetic layer (IRL) 141, the non-magnetic layer (FL1) 142, the ferromagnetic nitride layer (FNL1) 143, the non-magnetic layer (FL2) 144, and the ferromagnetic layer (MRL) 145 can behave as one ferromagnetic layer (reference layer RL) 140. As a result, it is possible to manufacture the reference layer RL having a structure larger in volume of magnetic material by the ferromagnetic nitride layer (FNL1) 143 and the ferromagnetic layer (MRL) 145 as compared to a case of a reference layer including only the ferromagnetic layer (IRL) 141.

The manufacturing of the reference layer RL is ended in the above-mentioned manner.

Also in the ferromagnetic layer (SCL) 160 (not shown), the ferromagnetic nitride layer (FNL2) 163 serves to prevent diffusion of materials from the ferromagnetic layer (SCL) 160 into the non-magnetic layer (CAP) 170 and from the non-magnetic layer (CAP) 170 into the ferromagnetic layer (SCL) 160 during the annealing process. The ferromagnetic nitride layer (FNL2) 163 suppresses diffusion of materials from the non-magnetic layer (AFS) 150 and the ferromagnetic layer (SCL) 160. As a result, various properties in the ferromagnetic layer (SCL) 160 etc., such as interface magnetic anisotropy, can also improve.

1.3. Advantageous Effects of Present Embodiment

In the first embodiment, the magnetic tunnel junction element 22 has a synthetic antiferromagnetic (SAF) coupling by the two ferromagnetic layers (RL and SCL) 140 and 160 via the non-magnetic layer (AFS) 150. The ferromagnetic layer (RL) 140 includes the ferromagnetic nitride layer (FNL1) 143, and the ferromagnetic layer (SCL) 160 includes the ferromagnetic nitride layer (FNL2) 163. The ferromagnetic nitride layer (FNL1) 143 and the ferromagnetic nitride layer (FNL2) 163 each include a covalent bond and have a high thermal stability.

Therefore, even when heat treatment is performed at a high temperature (300-400° C.) during the manufacturing of the magnetic tunnel junction element 22, for example, during the annealing process, the ferromagnetic nitride inside the ferromagnetic nitride layer (FNL1) 143 and the ferromagnetic nitride layer (FNL2) 163 is not liable to diffuse. Moreover, materials are not liable to enter the ferromagnetic nitride layer (FNL1) 143 and the ferromagnetic nitride layer (FNL2) 163. As described above, the ferromagnetic nitride layer (FNL1) 143 and the ferromagnetic nitride layer (FNL2) 163 serve as diffusion barriers. Due to the presence of the ferromagnetic nitride layer (FNL1) 143 and the ferromagnetic nitride layer (FNL2) 163, the materials forming each layer of the magnetic tunnel junction element 22 as a whole are less liable to diffuse in comparison to a case in which the ferromagnetic nitride layer (FNL1) 143 and the ferromagnetic nitride layer (FNL2) 163 are not present.

As a result, the ferromagnetic layer (IRL) 141 in the ferromagnetic layer (RL) 140 can be a high-quality crystalline material. Accordingly, an interfacial anisotropy between the ferromagnetic layer (IRL) 141 and the non-magnetic layer (FL1) 142 occurs, so that the ferromagnetic layer (IRL) 141 can achieve a high perpendicular magnetic anisotropy.

Similarly, in the ferromagnetic layer (MRL) 145 in the ferromagnetic layer (RL) 140 and the ferromagnetic layer (MSCL) 161 in the ferromagnetic layer (SCL) 160, deterioration in functioning due to flow of materials from these layers into other layers or from other layers into these layers is suppressed. For example, the perpendicular magnetic anisotropy that occurs due to cobalt of the ferromagnetic layer (MRL) 145 and platinum of the non-magnetic layer (FL2) 144 is maintained and the perpendicular magnetic anisotropy that occurs due to cobalt of the ferromagnetic layer (MSCL) 161 and platinum of the non-magnetic layer (FL3) 162 is maintained. It is known that perpendicular magnetic anisotropy is deteriorated if, for example, iron is mixed in cobalt and platinum layers as mentioned above. In the present embodiment, materials including iron are prevented from diffusing due to the presence of the ferromagnetic nitride layer (FNL1) 143 and the ferromagnetic nitride layer (FNL2) 163, thus deterioration of perpendicular magnetic anisotropy is suppressed.

Furthermore, since diffusion in/from the non-magnetic layer (AFS) 150 is also suppressed, deterioration of antiferromagnetic coupling between the ferromagnetic layer (MRL) 145 in the ferromagnetic layer (RL) 140 and the ferromagnetic layer (MSCL) 161 of the ferromagnetic layer (SCL) 160 via the non-magnetic layer (AFS) 150 is suppressed.

Furthermore, since tantalum etc. in, for example, the non-magnetic layer (FL1) 142 is suppressed from flowing into the non-magnetic layer (TB) 130, the reduction in MR ratio due to the flow of tantalum etc. into the non-magnetic layer (TB) 130 is also suppressed.

The ferromagnetic nitride layer (FNL1) 143 and the ferromagnetic nitride layer (FNL2) 163 have a high thermal stability as described above and serve as diffusion barriers, while having the perpendicular magnetic anisotropy. Therefore, the presence of those layers does not deteriorate the perpendicular magnetic anisotropy of the ferromagnetic layer (RL) 140 and the ferromagnetic layer (SCL) 160. Moreover, the ferromagnetic nitride layer (FNL1) 143 and the ferromagnetic nitride layer (FNL2) 163 have high electrical conductivity and low resistance. Accordingly, it is possible to prevent the write current flowing in the magnetic tunnel junction element 22 from excessively increasing. Therefore, the magnetic tunnel junction element 22 can be easily applied to a magnetic memory device.

As described above, the ferromagnetic nitride layer (FNL1) 143 and the ferromagnetic nitride layer (FNL2) 163 advantageously realize an excellent magnetic tunnel junction element 22 by suppressing the reduction in coupling energy of the antiferromagnetic coupling in the magnetic tunnel junction element 22, the reduction in the perpendicular magnetic anisotropy in each layer, and the reduction in change ratio of the resistance.

2. Modifications

The embodiment is not limited to the first embodiment described above, and various modifications can be made.

Figure 7:
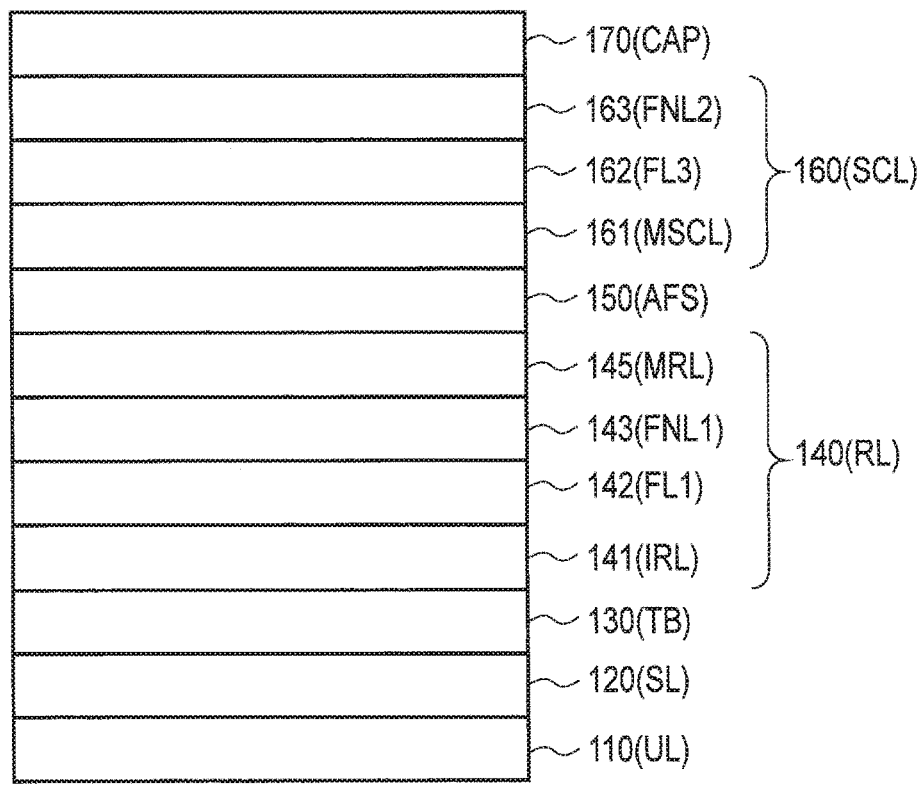
FIG. 7 is a schematic diagram for explaining a configuration of a magnetic tunnel junction element of the magnetic device according to a modification of the first embodiment.
Figure 8:
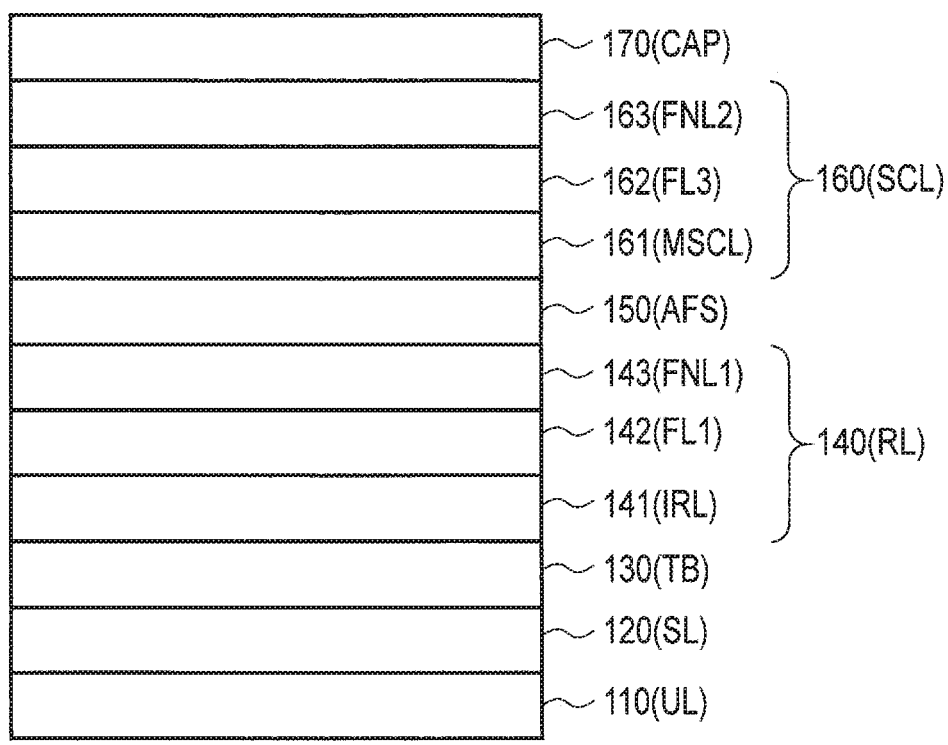
FIG. 8 is a schematic diagram for explaining a configuration of a magnetic tunnel junction element of the magnetic device according to a modification of the first embodiment.

For example, some layers of the structure shown in FIG. 3 may be omitted. For example, as shown in FIG. 7, the non-magnetic layer (FL2) 144 may be omitted. In this case also, the magnetic tunnel junction element 22 includes an antiferromagnetic coupling by the ferromagnetic layer (MRL) 145 and the ferromagnetic layer (MSCL) 161 via the non-magnetic layer (AFS) 150. Furthermore, as shown in FIG. 8, the ferromagnetic layer (MRL) 145 may be omitted. In this case also, the magnetic tunnel junction element 22 includes an antiferromagnetic coupling by the ferromagnetic nitride layer (FNL1) 143 and the ferromagnetic layer (MSCL) 161 via the non-magnetic layer (AFS) 150.

Figure 9:
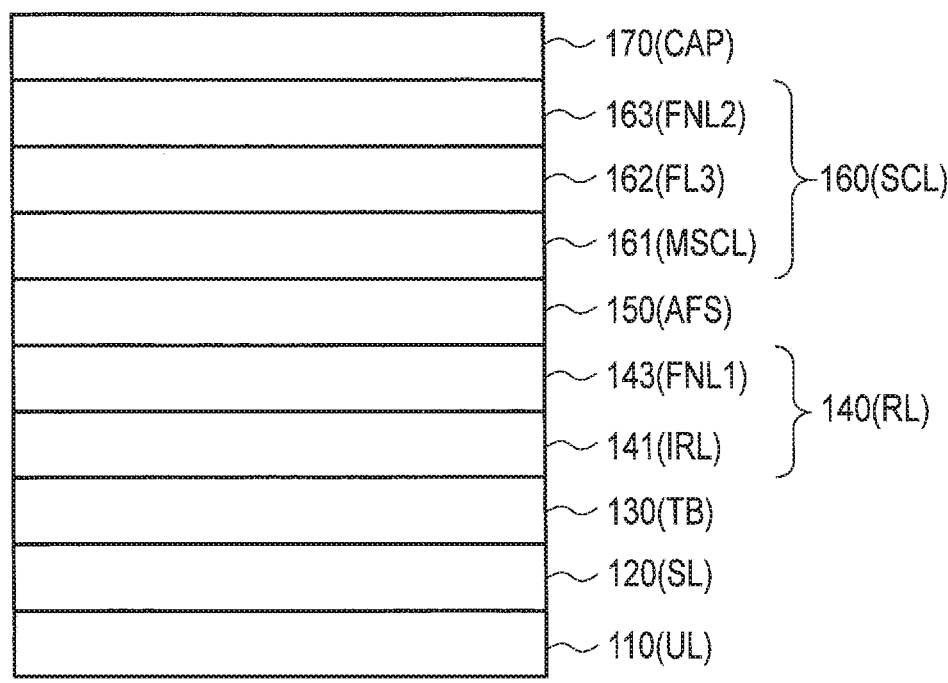
FIG. 9 is a schematic diagram for explaining a magnetic tunnel junction element of the magnetic device according to a modification of the first embodiment.
Figure 10:
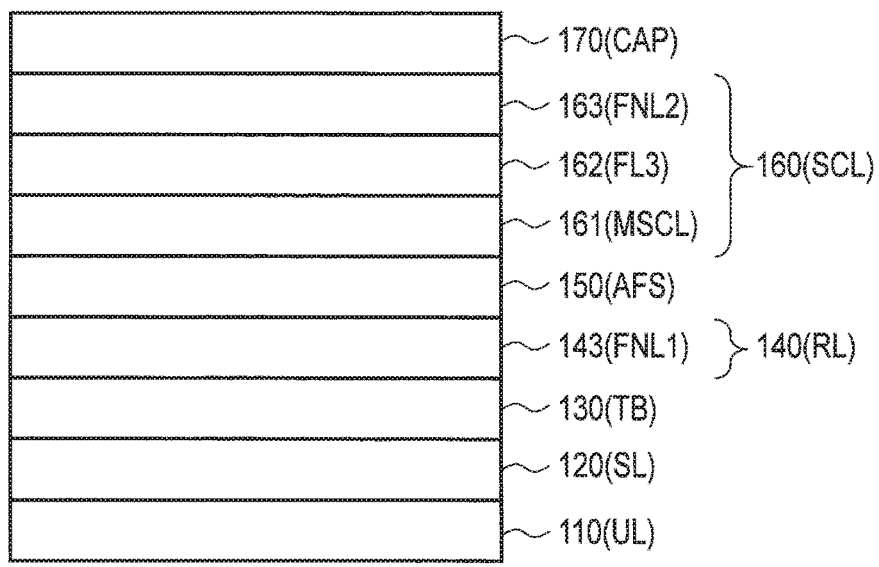
FIG. 10 is a schematic diagram for explaining a configuration of a magnetic tunnel junction element of the magnetic device according to a modification of the first embodiment.

Furthermore, as shown in FIG. 9, the non-magnetic layer (FL1) 142 may be omitted. In this case also, the magnetic tunnel junction element 22 can achieve a tunnel magnetoresistance effect due to the presence of the ferromagnetic layer (SL) 120 and the ferromagnetic layer (IRL) 141 with the non-magnetic layer (TB) 130 interposed therebetween. Furthermore, as shown in FIG. 10, the ferromagnetic layer (IRL) 141 may be omitted. In this case also, the magnetic tunnel junction element 22 can achieve a tunnel magnetoresistance effect due to the presence of the ferromagnetic nitride layer (FNL1) 143 with the non-magnetic layer (TB) 130 interposed therebetween.

It is possible to adopt a configuration in which the ferromagnetic nitride layer (FNL1) 143, the non-magnetic layer (FL2) 144, and the ferromagnetic layer (MRL) 145 are present, while the non-magnetic layer (FL1) 142 is not present or the ferromagnetic layer (IRL) 141 and the non-magnetic layer (FL1) 142 are not present.

In the first embodiment and the modifications described above, the magnetic tunnel junction element 22 is a bottom-free type, in which the storage layer SL is provided near the semiconductor substrate 20. However, the magnetic tunnel junction element 22 may be a top-free type, in which the reference layer RL is provided near the semiconductor substrate 20.

Figure 11:
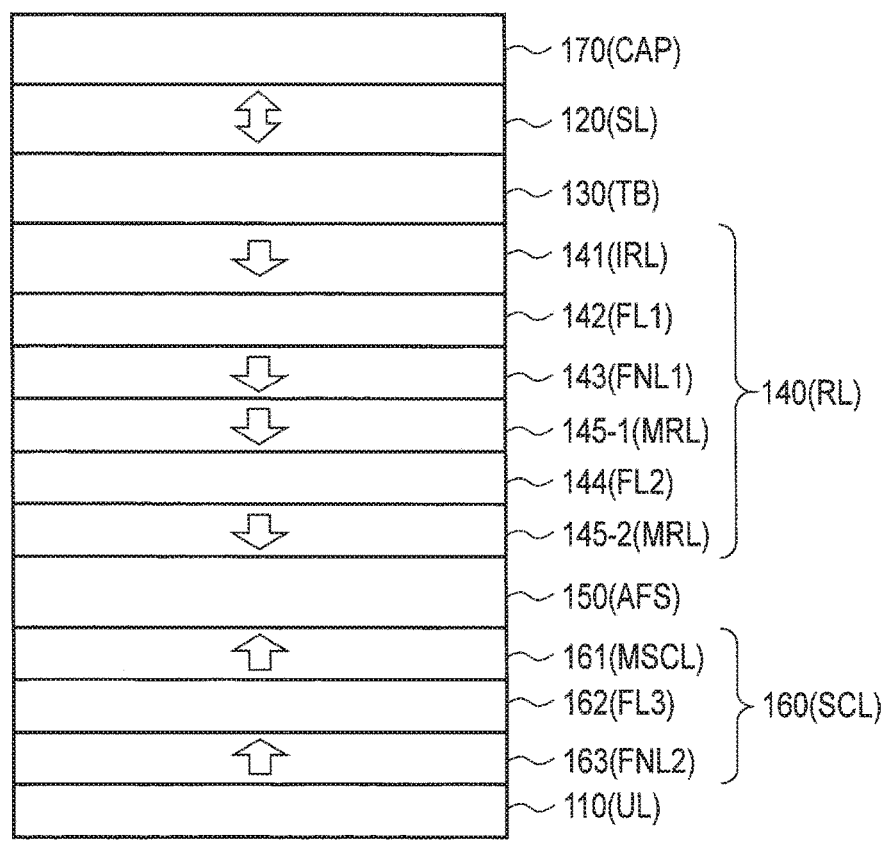
FIG. 11 is a schematic diagram for explaining a configuration of a magnetic tunnel junction element of the magnetic device according to a modification of the first embodiment.

FIG. 11 is a schematic view showing an example in which the magnetic tunnel junction element 22 is configured as a top-free type. The magnetic tunnel junction element 22 shown in FIG. 11 includes the non-magnetic layer (UL) 110 serving as an underlayer, the ferromagnetic layer (SCL) 160 serving as a shift canceling layer, the non-magnetic layer (AFS) 150 serving as an antiferromagnetic spacer, the ferromagnetic layer (RL) 140 serving as a reference layer, the non-magnetic layer (TB) 130 serving as a tunnel barrier layer, the ferromagnetic layer (SL) 120 serving as a storage layer, and the non-magnetic layer (CAP) 170 serving as a capping layer, which are layered in this order. The ferromagnetic layer (RL) 140 and the ferromagnetic layer (SCL) 160 respectively include the ferromagnetic nitride layer (FNL1) 143 and the ferromagnetic nitride layer (FNL2) 163.

Since the ferromagnetic layer (MRL) 145 must be present immediately on the non-magnetic layer (AFS) 150, in the structure shown in FIG. 11, a ferromagnetic layer (MRL) 145-2, the non-magnetic layer (FL2) 144, and the ferromagnetic layer (MRL) 145-1 are arranged in this order on the non-magnetic layer (AFS) 150.

Figure 12:
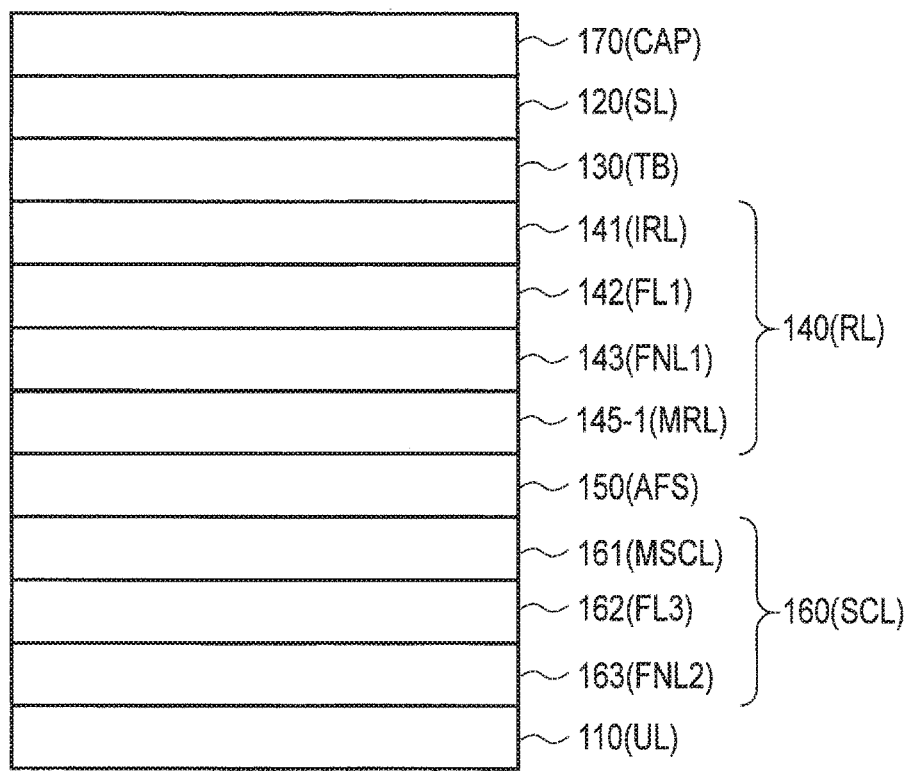
FIG. 12 is a schematic diagram for explaining a configuration of a magnetic tunnel junction element of the magnetic device according to a modification of the first embodiment.
Figure 13:
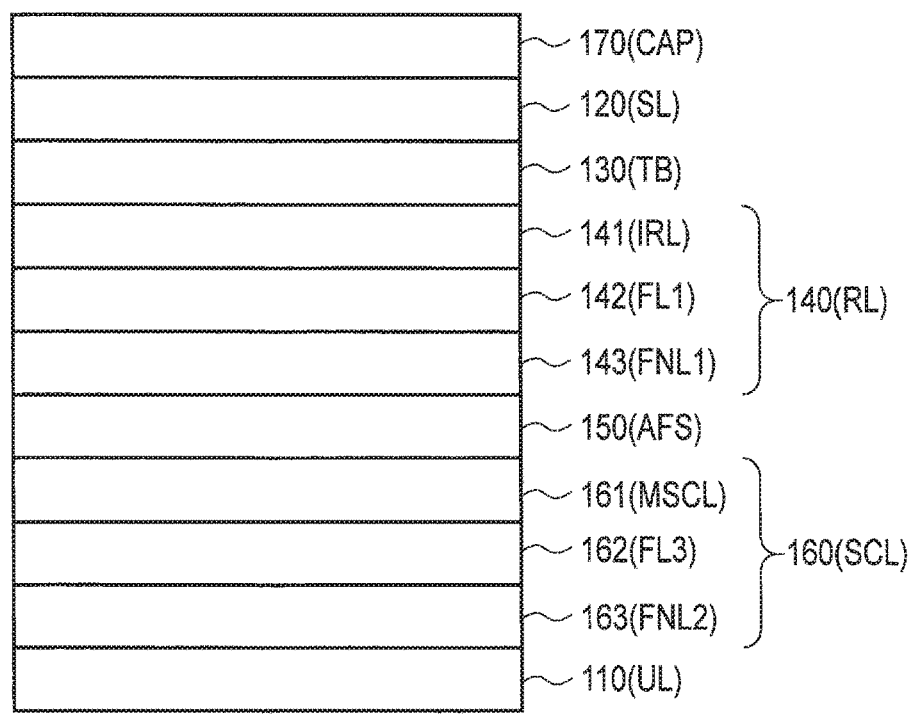
FIG. 13 is a schematic diagram for explaining a configuration of a magnetic tunnel junction element of the magnetic device according to a modification of the first embodiment.

For example, some layers of the structure shown in FIG. 11 may be omitted. For example, as shown in FIG. 12, the non-magnetic layer (FL2) 144 and the ferromagnetic layer (MRL2) 145-2 may be omitted. In this case also, the ferromagnetic layer (MRL) 145-1 is arranged immediately on the non-magnetic layer (AFS) 150. Furthermore, as shown in FIG. 13, the ferromagnetic layer (MRL1) 145-1 may be omitted. In this case also, the ferromagnetic nitride layer (FNL1) 143 is arranged immediately on the non-magnetic layer (AFS) 150. Furthermore, as shown in FIG. 14, the non-magnetic layer (FL1) 142 may be omitted. In this case also, the magnetic tunnel junction element 22 can achieve a tunnel magnetoresistance effect due to the presence of the ferromagnetic layer (SL) 120 and the ferromagnetic layer (IRL) 141 with the non-magnetic layer (TB) 130 interposed therebetween. Furthermore, the ferromagnetic layer (IRL) 141 may be omitted. In this case also, the magnetic tunnel junction element 22 can achieve a tunnel magnetoresistance effect due to the presence of the ferromagnetic layer (SL) 120 and the ferromagnetic nitride layer (FNL1) 143 with the non-magnetic layer (TB) 130 interposed therebetween.

In the first embodiment and the modifications described above, the magnetic memory device including an MTJ element is explained as an example of the magnetic device including a magnetic tunnel junction element. However, the embodiment and the modifications are not limited to the above. For example, the magnetic device includes another device that requires a magnetic element having a perpendicular magnetic anisotropy, such as a sensor and a medium.

In the above embodiment, a select transistor with three terminals is described as a switching element. However, for example, the select transistor may be a switching element to switch between two terminals. If the voltage applied across the two terminals of a switching element is a threshold value or lower, the switching element is a "high-resistance" state, for example, an electrically non-conductive state. If the voltage applied across the two terminals exceeds the threshold value, the switching element is changed to a "low-resistance" state, for example, an electrically conductive state. The switching element may have this function regardless of whichever polarity the voltage has. In other words, the switching element to switch between two terminals may have the above function in two directions. For example, the switching element may include at least one chalcogen element selected from the group consisting of Te, Se, and S. Alternatively, the switching element may include a chalcogenide, which is a compound including the chalcogen element. The switching element may further include at least one element selected from the group consisting of B, Al, Ga, In, C, Si, Ge, Sn, As, P, and Sb. Such a switching element to switch between two terminals is coupled to the magnetic tunnel junction element via two contact plugs as in the embodiment described above. One of the two contact plugs that is near the magnetic tunnel junction element includes, for example, copper. A conductive layer (for example, including tantalum) may be provided between the magnetic tunnel junction element and a conductive layer (for example, including tantalum).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic device comprising a magnetic tunnel junction element, the magnetic tunnel junction element comprising:

a first structure having ferromagnetism;

a second structure having ferromagnetism;

a first nonmagnetic layer provided between the first structure and the second structure;

a second nonmagnetic layer provided on a surface of the first structure opposite from a surface of the first structure on which the first nonmagnetic layer is provided; and a first ferromagnetic layer provided on a surface of the second nonmagnetic layer opposite from a surface of the second nonmagnetic layer on which the first structure is provided, wherein:

the first structure and the second structure are antiferromagnetically coupled via the first nonmagnetic layer;

the first structure includes a first ferromagnetic nitride layer;

the second nonmagnetic layer includes magnesium oxide; and the first structure, the second nonmagnetic layer, and the first ferromagnetic layer have:

a first resistance when a first current flowing from the first structure to the first ferromagnetic layer is supplied; and a second resistance smaller than the first resistance when a second current flowing from the first ferromagnetic layer to the first structure is supplied.

2. The magnetic device according to claim 1, wherein the first ferromagnetic nitride layer includes a nitrogen compound of at least one of iron, cobalt, and nickel.

3. The magnetic device according to claim 1, wherein the first nonmagnetic layer includes at least one of ruthenium, iridium, rhodium, and osmium.

4. The magnetic device according to claim 1, wherein the second structure includes a second ferromagnetic layer adjacent to the first nonmagnetic layer.

5. The magnetic device according to claim 4, wherein the second ferromagnetic layer includes at least one of iron, cobalt, and nickel.

6. The magnetic device according to claim 1, wherein the first structure further includes a second ferromagnetic layer provided in contact with the second nonmagnetic layer and between the second nonmagnetic layer and the first ferromagnetic nitride layer.

7. The magnetic device according to claim 6, wherein the third ferromagnetic layer includes at least one of iron, cobalt, and nickel.

8. The magnetic device according to claim 6, wherein the first structure further includes a third nonmagnetic layer provided between the first ferromagnetic nitride layer and the second ferromagnetic layer.

9. The magnetic device according to claim 8, wherein the third nonmagnetic layer includes at least one of tantalum, molybdenum, tungsten, rhodium, iridium, ruthenium, and platinum.

10. The magnetic device according to claim 1, wherein the first structure further includes a second ferromagnetic layer provided in contact with the first nonmagnetic layer and between the first nonmagnetic layer and the first ferromagnetic nitride layer.

11. The magnetic device according to claim 10, wherein the second ferromagnetic layer includes at least one of iron, cobalt, and nickel.

12. The magnetic device according to claim 4, wherein the second structure further includes a second ferromagnetic nitride layer provided on a surface of the second ferromagnetic layer opposite from a surface of the second ferromagnetic layer on which the first nonmagnetic layer is provided.

13. The magnetic device according to claim 12, wherein the second ferromagnetic nitride layer includes a nitrogen compound of at least one of iron, cobalt, and nickel.

14. The magnetic device according to claim 12, wherein the second structure further includes a third nonmagnetic layer provided between the second ferromagnetic later and the second ferromagnetic nitride layer.

15. The magnetic device according to claim 14, wherein the third nonmagnetic layer includes at least one of platinum, tantalum, molybdenum, tungsten, rhodium, iridium, and ruthenium.

* * * * *